United States Patent
Naylor et al.

(10) Patent No.: US 12,394,716 B2
(45) Date of Patent: Aug. 19, 2025

(54) INTEGRATED CIRCUIT INTERCONNECT STRUCTURES WITH GRAPHENE CAP

(71) Applicant: Intel Corporation, Santa Clara, CA (US)

(72) Inventors: Carl Naylor, Portland, OR (US);
Jasmeet Chawla, Hillsboro, OR (US);
Matthew Metz, Portland, OR (US);
Sean King, Beaverton, OR (US);
Ramanan Chebiam, Hillsboro, OR (US); Mauro Kobrinsky, Portland, OR (US); Scott Clendenning, Portland, OR (US); Sudarat Lee, Hillsboro, OR (US); Christopher Jezewski, Portland, OR (US); Sunny Chugh, Hillsboro, OR (US); Jeffery Bielefeld, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 880 days.

(21) Appl. No.: 17/358,962

(22) Filed: Jun. 25, 2021

(65) Prior Publication Data

US 2022/0415818 A1 Dec. 29, 2022

(51) Int. Cl.
*H01L 23/532* (2006.01)
*H01L 21/3215* (2006.01)
*H01L 21/768* (2006.01)

(52) U.S. Cl.
CPC .... *H01L 23/53238* (2013.01); *H01L 21/3215* (2013.01); *H01L 21/7685* (2013.01); *H01L 23/53266* (2013.01)

(58) Field of Classification Search
CPC .......................... H01L 21/74; H01L 23/53726
See application file for complete search history.

(56) References Cited

U.S. PATENT DOCUMENTS 6,800,554 B2 * 10/2004 Marieb ............ H01L 21/76867
257/E21.585
9,768,065 B1 9/2017 Wang et al.
(Continued)

FOREIGN PATENT DOCUMENTS

CN 102593098 7/2012

OTHER PUBLICATIONS

Gambino, J. P. (2010). Improved reliability of copper interconnects using alloying. 2010 17th IEEE International Symposium on the Physical and Failure Analysis of Integrated Circuits, 1-7. https://doi.org/10.1109/ipfa.2010.5532242 (Year: 2010).*

(Continued)

*Primary Examiner* — Christine S. Kim
*Assistant Examiner* — Cole Leon Lindsey
(74) *Attorney, Agent, or Firm* — Essential Patents Group, LLP

(57) ABSTRACT

Integrated circuitry interconnect structures comprising a first metal and a graphene cap over a top surface of the first metal. Within the interconnect structure an amount of a second metal, nitrogen, or silicon is greater proximal to an interface of the graphene cap. The presence of the second metal, nitrogen, or silicon may improve adhesion of the graphene to the first metal and/or otherwise improve electromigration resistance of a graphene capped interconnect structure. The second metal, nitrogen, or silicon may be introduced into the first metal during deposition of the first metal, or during a post-deposition treatment of the first metal. The second metal, nitrogen, or silicon may be introduced prior to, or after, capping the first metal with graphene.

19 Claims, 12 Drawing Sheets

(56) References Cited

U.S. PATENT DOCUMENTS

| | | |
|---|---|---|
| 2010/0029078 A1 | 2/2010 | Russell et al. |
| 2013/0299988 A1 | 11/2013 | Bonilla et al. |
| 2017/0077235 A1* | 3/2017 | Caudillo .............. H10D 48/385 |
| 2018/0033727 A1 | 2/2018 | Lee et al. |
| 2018/0261537 A1 | 9/2018 | Lin et al. |
| 2020/0035602 A1* | 1/2020 | Nam ................. H01L 23/53276 |
| 2021/0082832 A1 | 3/2021 | Yang et al. |

OTHER PUBLICATIONS

Extended European Search Report from European Patent Application No. 22178898.7 notified Jan. 4, 2023, 8 pgs.

* cited by examiner

INTEGRATED CIRCUIT INTERCONNECT STRUCTURES WITH GRAPHENE CAP

BACKGROUND

Demand for higher performance integrated circuits (ICs) in electronic device applications has motivated increasingly dense transistor architectures. Interconnect parasitics become a greater challenge as the density of interconnect structures keeps pace with transistor density. For example, the resistance-capacitance (RC) delay associated with interconnects of an IC increases with the density of the interconnects.

Conventional IC interconnect structures include electrically conductive lines within separate interconnect levels and electrically conductive vias linking together various metal lines between adjacent interconnect levels. In dual-damascene structures, vias and trenches etched into a dielectric material are filled with one or more conductive materials to form the conductive vias and lines. As interconnect line dimensions scale down, resistance of the interconnect structures increases, particularly the lines.

The introduction of graphene can reduce electrical resistance of an interconnect structure, particularly a line. Graphene may, for example, be introduced onto a sidewall, bottom surface, or top surface of an interconnect line.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
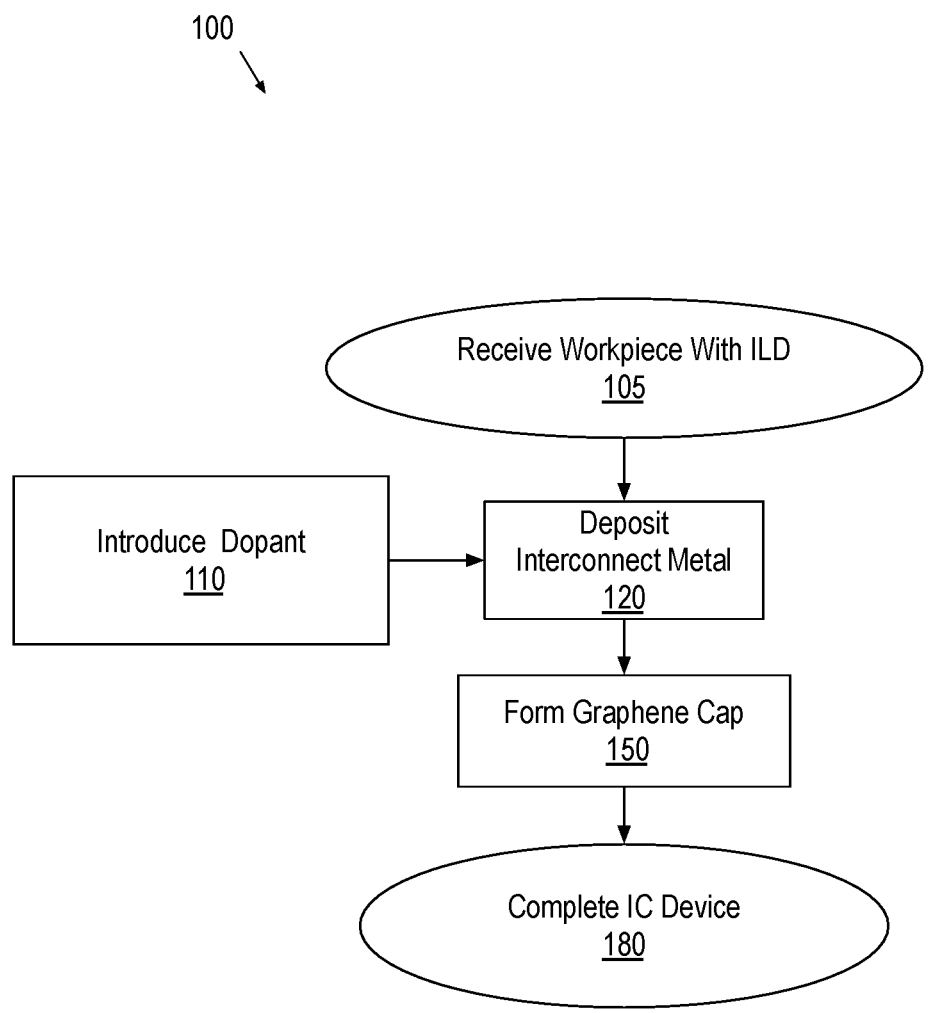
FIG. 1 is a flow diagram illustrating methods of forming an IC interconnect structure including a graphene cap, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

FIG. 1 is a flow diagram illustrating methods 100 of forming an IC interconnect structure including a graphene cap, in accordance with some embodiments. Methods 100 begin at input 105 with receipt of a workpiece. In some embodiments, the workpiece includes a semiconductor wafer, such as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more device layers including a semiconductor material layer, and may also have one or more interconnect levels interconnecting devices (e.g., transistors) of the device layers.

In exemplary embodiments, a top surface of the workpiece comprises dielectric material, often referred to as an interlayer dielectric (ILD) as it may separate adjacent layers, or levels, of interconnect structures. Interconnect structures may be either conductive vias that provide a vertical electrically conductive pathway through an interconnect level and/or between levels, or conductive lines that provide a lateral or horizontal conductive pathway within an interconnect level. The dielectric material(s) may be directly over semiconductor device structures (e.g., gate, source and drain terminals of a transistor), or over any number of lower-level interconnect structures that are coupled to semiconductor device structures. In some damascene or dual-damascene embodiments, the dielectric material as received at input 105 has been patterned with trenches and/or via openings. In alternative subtractive interconnect embodiments, the insulator received at input 105 is substantially planar.

Methods 100 continue at block 120 where an interconnect metal is deposited upon the dielectric material. In damascene or dual-damascene embodiments, the interconnect metal at least partially backfills the trenches and/or via openings within the dielectric material. In subtractive interconnect embodiments, planar interconnect metal layers deposited at block 120 may be subtractively patterned into an interconnect structure. For some metals more difficult to subtractively pattern, such as copper (Cu), a highly physical milling process may be practiced, for example with an ion beam etching (IBE) source where Ar or He ions are accelerated into the workpiece surface with high kinetic energies in order to sputter away exposed metal. For interconnect metal compositions that may be more readily etched, such as ruthenium (Ru), molybdenum (Mo) or tungsten (W), a chemical etching process may be practiced, for example with a plasma of one or more one or more of $O_2$, $Cl_2$, $Br_2$, $CF_4$, $C_2F_6$, $C_4F_8$, $H_2$, $CH_4$, $CH_3CH_3$, $CH_3OH$, $CH_3CH_2OH$, Ar, He, or Xe.

Methods 100 continue at block 150 where a graphene cap is formed over a top surface of the interconnect metal. As described further below, the integrated circuit interconnect structure will therefore comprise a graphene cap over an underlying interconnect metal. For damascene or dual-damascene embodiments, the graphene may be advantageously formed on the underlying metal after a planarization process has reduced the interconnect metal into interconnect structures that are confined to the trenches and/or via openings within the dielectric material. The graphene formed at block 150 will therefore be a cap located on only a top surface of the interconnect structures. For subtractive patterning embodiments, the graphene may be formed on the interconnect metal before or after the subtractive patterning of the interconnect metal. For the former, the graphene cap will only be on a top surface of an interconnect structure, similar to (dual) damascene embodiments. For the latter, the graphene cap may be on both a top surface of the interconnect structure as well as on a sidewall of the interconnect structure.

At block 150, crystalline graphene is grown, or otherwise formed, upon exposed surfaces of interconnect lines. The graphene cap may be formed at block 150 according to a number of techniques with one example being chemical vapor deposition (CVD). The composition of the interconnect metal is advantageously suitable for nucleation of a graphene layer such that, during the CVD process, a carbon source such as methane gas is decomposed to form graphene crystals selectively upon metal nucleation sites with little to no graphene forming on adjacent dielectric material.

A graphene cap over at least a top surface of an interconnect feature can significantly reduce the electrical resistance of the interconnect structure. For example, the inventors have measured a resistance reduction of 10-15% relative to a structure lacking a graphene cap. The resistance reduction may be a result of reduced charge carrier surface scattering. Although the reduced electrical resistance of a graphene-metal hybrid interconnect structure is promising, the inventors have further determined that structures with a graphene cap can suffer a reduced resistance to electromigration (EM).

As further illustrated in FIG. 1, at block 110 a dopant is introduced into the interconnect metal. The inventors have determined that EM resistance of an interconnect structure comprising a graphene capped metal can be improved by introducing one or more dopants into the underlying metal. With some component of lower electromigration resistance potentially attributable to poor adhesion between the graphene cap and the underlying metal, dopant(s) that can bond to the graphene more strongly may be particularly advantageous. However, the inventors have determined that the addition of certain dopants at block 110, even if successful in improving EM resistance, can increase an interconnect structure's electrical resistance and may therefore at least partially counter the benefit of incorporating a graphene cap into an interconnect structure. The choice of dopant(s) to introduce at block 110 is therefore complicated by competing effects of the dopant within a graphene-metal interconnect structure.

Methods 100 end at output 180 where an IC device is completed. For example, any upper-level interconnect structures may be fabricated to complete an IC according to any techniques. In some embodiments, output 180 may further comprise one or more additional iterations of blocks 120, 110 and 150, for example along with depositions of additional dielectric material. Either the dielectric material may be patterned in damascene interconnect embodiments, or the interconnect metal may be patterned in subtractive interconnect embodiments.

Figure 2A:
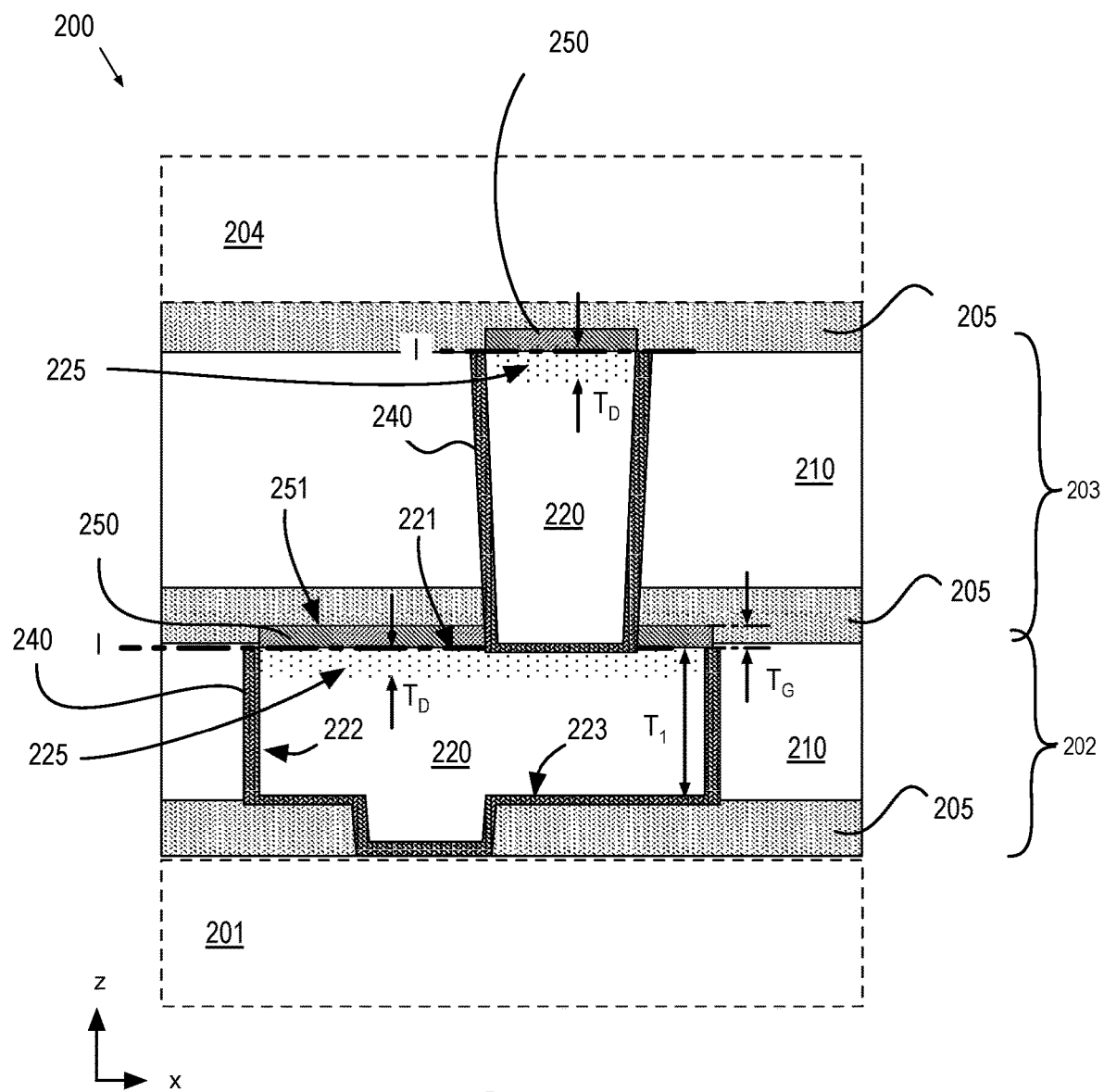
FIG. 2A illustrates a cross-sectional view of an IC interconnect structure including a graphene cap, in accordance with some damascene embodiments.

FIG. 2A illustrates a cross-sectional view of an IC device structure 200 in accordance with exemplary (dual) damascene embodiments. IC device structure 200 includes an interconnect level 202 and an interconnect level 203 over interconnect level 202. Interconnect level 202 is over substrate 201. Substrate 201 is illustrated in dashed line to emphasize substrate 201 may include any number of device layers comprising transistors (e.g., MOSFETs), any number of interconnect levels interconnect the transistors intro circuitry, and any type of support substrate, such as, but not limited to monocrystalline semiconductor material. Over interconnect level 203, IC device structure 200 may include any number of additional interconnect levels 204, also illustrated in dashed line as merely providing context to the interconnect levels 202 and 203 illustrated in solid line.

Two adjacent interconnect levels 202 and 203 are illustrated to depict both transverse and longitudinal cross-sections of exemplary graphene-capped metal interconnect structures. The interconnect structure of interconnect level 202 comprises a line extending along the x axis over a dielectric material 205, and a via extending along the z-axis through dielectric material 205. The interconnect structure of interconnect level 203 comprises another line extending along the y axis (e.g., into the page) over dielectric material 205, and another via extending along the z-axis through dielectric material 205 to intersect interconnect level 202.

Layers of dielectric material 205 are between another dielectric material 210 with dielectric material 210 being adjacent to the interconnect structures. Dielectric materials 205 and 210 are of different chemical composition, for example so that dielectric materials 205 may function as etch stops during a dielectric patterning process. Each of dielectric material 205 and dielectric material 210 may be any of any composition known to be suitable for IC interconnects. In some embodiments, dielectric material 210 is a low-k dielectric material (e.g., SiOC), for example having a relative permittivity below 3.5. In other examples, dielectric material 210 may be any of SiO, SiON, hydrogen silsesquioxane, methyl silsesquioxane, polyimide, polynorbornenes, benzocyclobutene, or the like. Dielectric material 205 may also be a low-k dielectric material having a relative permittivity less than about 3.5. Dielectric material 205 may also be a conventional dielectric material with a somewhat higher relative permittivity in the range of 3.5-9, or a high-k dielectric material having an even higher relative permittivity. For some embodiments where dielectric material 205 has a higher relative permittivity than that of dielectric material 210, dielectric material 205 is a silicon-based dielectric, for example comprising predominantly Si and at least one of O (e.g., SiOx) or N (e.g., SiNx, SiON), any of which may also be carbon-doped (e.g., carbon-doped nitride).

Interconnect structures within each of interconnect levels 202 and 203 have a graphene cap 250 over an interconnect metal 220. Graphene cap 250 comprises one or more monolayers of crystalline graphene. Because of a minimal thickness $T_G$, for example corresponding to only 1-2 monolayers of material, graphene cap 250 may be referred to as two-dimensional (2D). The microstructure of graphene cap 250 may be polycrystalline with discontinuities extending through the monolayers (e.g., in z-dimension) to define grain boundaries where the long range order within a grain of graphene cap 250 is disrupted. In some exemplary embodiments, individual grains within graphene cap 250 all have the full thickness $T_G$ with no two grains being stacked one atop the other. Hence, even when polycrystalline, each grain is 2D. Within an interconnect structure, a bottom surface of graphene cap 250 defines a substantially planar interface I, which in the illustrated example is co-planar with a bottom surface of dielectric material 205. Dielectric material 205 is over a top surface 251 of graphene cap 250 except where a via passes through dielectric material 205.

In some exemplary embodiments, interconnect metal 220 is predominantly Cu, and may be substantially pure Cu, or a Cu-rich alloy. For such embodiments, interconnect metal 220 may be in direct contact with graphene cap 250 at interface I, as illustrated, because interconnect metal top surface 221 is then a suitable nucleation surface for the growth of graphene. Interconnect metal 220 may also be predominantly one or more metals other than Cu. In some alternative embodiments, interconnect metal 220 is predominantly Ru or Co, which have also been found to provide suitable graphene nucleation surface, and so can be in direct contact with graphene cap 250 at interface I. In still other embodiments, interconnect metal 220 may be predominantly another metal, such as, but not limited to, W or Mo. For interconnect metal compositions less suitable for direct contact with graphene cap 250, an intervening cap or graphene seed layer (not depicted) of a suitable metal composition may be present between graphene cap 250 and interconnect metal 220.

Interconnect structures within each of interconnect levels 202 and 203 further comprise a barrier layer 240. In the illustrated example, barrier layer 240 is between interconnect metal sidewall 222 and a sidewall of dielectric material 210. Barrier layer 240 is also between interconnect metal bottom surface 223 and dielectric material 205. Barrier layer 240 is of a composition distinct from interconnect metal 220, and may be a metal, metal chalcogenide, metal oxide, or metal nitride, for example. In some exemplary embodiments, barrier layer 240 comprises tantalum (Ta), W, Mo, titanium (Ti), or cobalt (Co). In some embodiments where interconnect metal is predominantly Cu, barrier layer 240 is TaN$_x$. In the illustrated embodiment, graphene cap 250 is confined to the area of interconnect metal top surface 221, and is absent from the portion barrier layer 240 co-planar with interface I.

Interconnect structures in accordance with embodiments herein may also include an adhesion layer (not depicted) between either barrier layer 240 and dielectric materials 205 and/or 210, or being interconnect metal 220 and barrier layer 240. The composition of adhesion materials may also vary, with Ti and TiN being two examples.

As further illustrated in FIG. 2A, interconnect metal 220 comprises a dopant 225 that improves adhesion of graphene cap 250 and/or otherwise improves EM resistance of the interconnect structure. In advantageous embodiments, dopant 225 is concentrated within a thickness $T_D$ proximal to graphene cap interface I. Within thickness $T_D$ the amount of dopant 225 is greater than any portion of interconnect metal 220 more distal from interface I along interconnect metal thickness $T_1$. Interconnect metal thickness $T_1$ may be in the tens of nm, for example, while thickness $T_D$ is less than 10 nm, and advantageously less than 5 nm. As concentrated proximal to interface I, any electrical resistance penalty associated with dopant 225 can be minimized while improvement in EM resistance can be maximized.

In some embodiments, dopant 225 is another metal. Dopant 225 may be, for example, one or more of manganese (Mn), zinc (Zn), magnesium (Mg), cobalt (Co), or aluminum (Al). The inventors have found Mn and Zn to be advantageous as readily migrating toward interconnect metal surface 221. This migration concentrates the metal dopants proximal to graphene cap interface I even if they are first introduced into more distal regions of interconnect metal 220, for example as described further below. The migration may be so complete that dopant 225 may be substantially absent from interconnect metal 220 at distances from interface I exceeding $T_D$. The inventors have further found Mn to be particularly advantageous as incurring a negligible electrical resistance penalty. While Al was also found to improve EM resistance, it incurred a greater electrical resistance penalty. Although not bound by theory, the higher electrical resistance may indicate Al does not concentrate proximal to interface I as readily as Mn.

In some alternative embodiments, dopant 225 is silicon or nitrogen. To limit the impact of these dopants on electrical resistance of the interconnect structure, silicon or nitrogen may be similarly confined to with dopant thickness $T_D$, for example by exposing only interconnect metal top surface 221 to some surface treatment, as further described below.

Figure 2B:
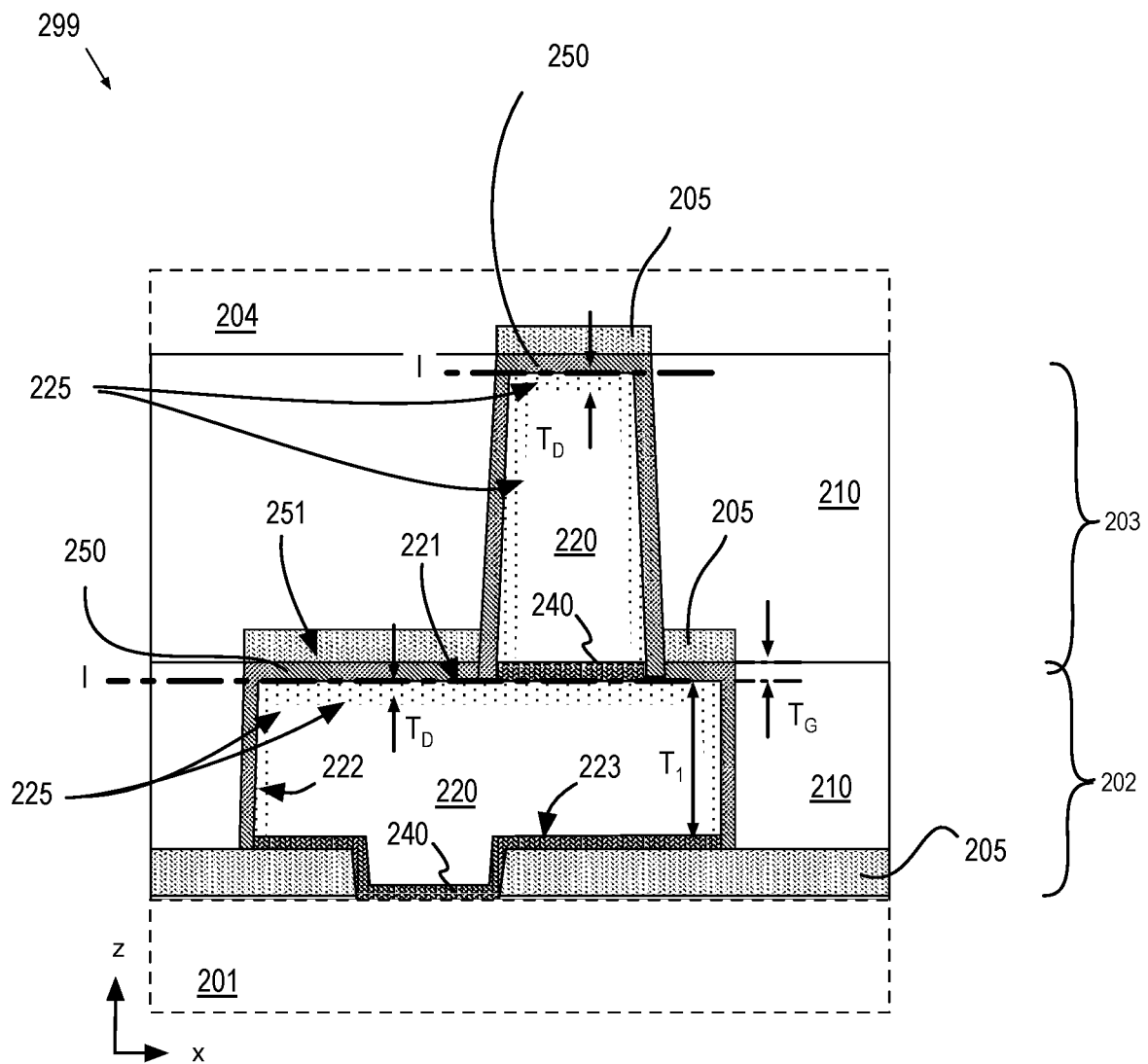
FIG. 2B illustrates a cross-sectional view of an IC interconnect structure including a graphene cap, in accordance with some subtractive embodiments.

FIG. 2B illustrates a cross-sectional view of an IC interconnect structure 299 including graphene cap 250, in accordance with some subtractive embodiments where interconnect structures in each of interconnect levels 202 and 203 have been subtractively patterned from planar metallization layers. Reference numbers introduced in the context of FIG. 2A are retained in FIG. 2B where the structural feature shares one or more of the attributes described above. For example, interconnect metal 220 may again be predominantly Cu. However, for subtractive embodiments, interconnect metal 220 may instead be a metal more readily etched, such as Ru, Co, W or Mo. Dopants 225 may likewise be any of those described above.

For subtractively patterned interconnect structures, barrier layer 240 is only on a bottom surface (e.g., bottom surface 223) of interconnect metal 220. FIG. 2B illustrates an example where graphene cap 250 is on both a top surface (e.g., top surface 221) and a sidewall (e.g., sidewall surface 222) of interconnect metal 220. Interconnect metal 220 was therefore patterned prior to growth of graphene cap 250. Dopants 225, being concentrated within thickness $T_D$, are therefore also present within top surface 221 and sidewall surface 222. Dielectric material 205 may again be present (e.g., as an etch stop layer). However, planar interface I between top surface 221 and graphene cap 250 is in this example below a planar interface between two layers of dielectric material 210.

As noted above, graphene cap 250 may also be grown on a planar metallization layer prior to subtractive patterning of the interconnect structures, and graphene cap 250 would then be present only on the interconnect top surface 221, substantially as illustrated in FIG. 2A. Dopants 225 would likewise then again be concentrated only within top surface 221.

Figure 3:
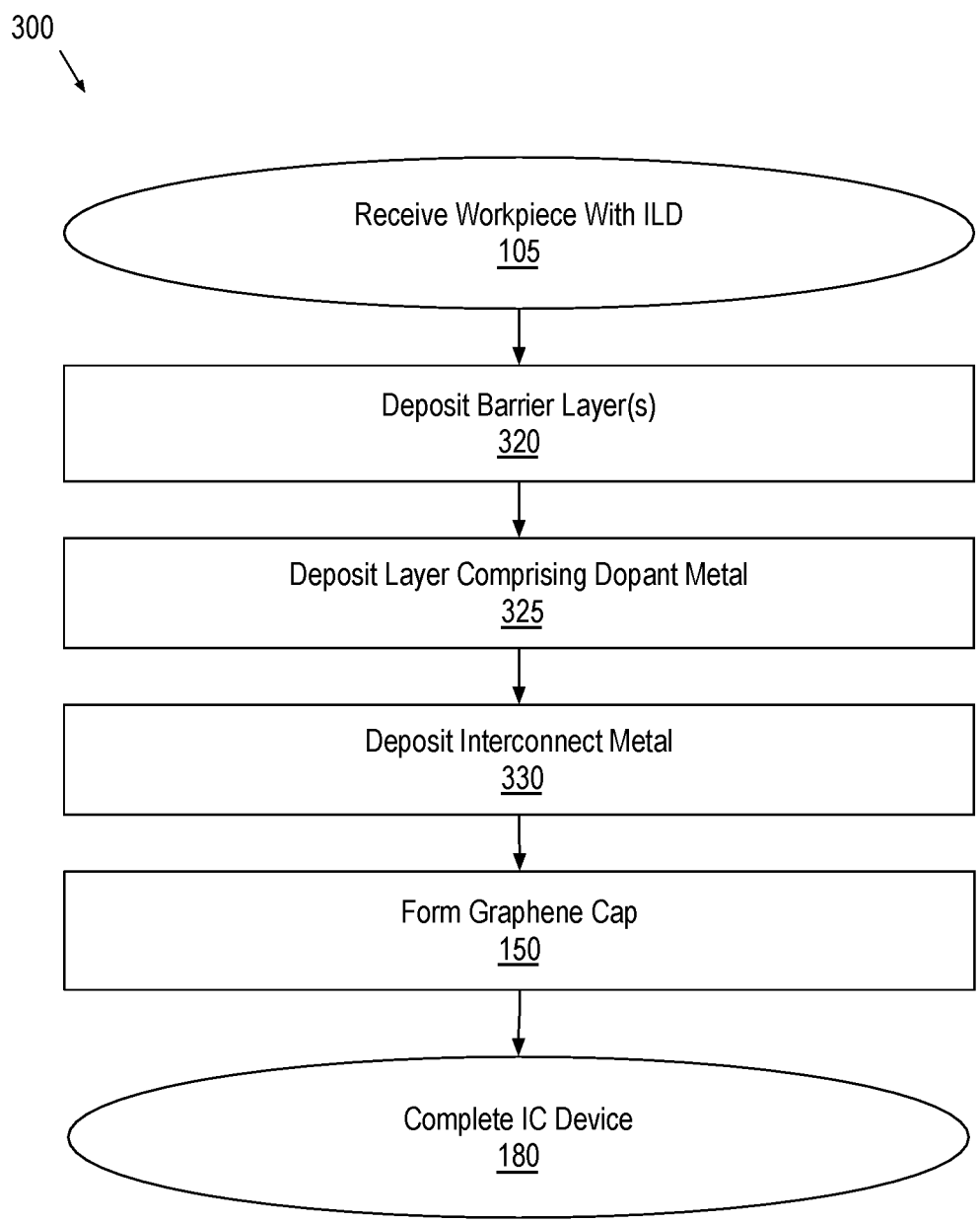
FIG. 3 is a flow diagram illustrating methods of integrating a graphene gap into an IC interconnect structure, in accordance with some embodiments.
Figure 4A:
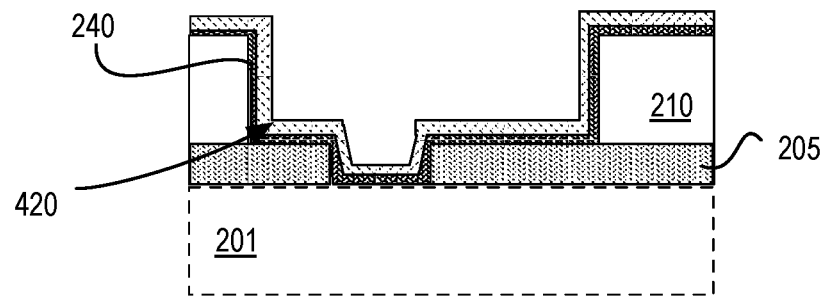
FIGS. 4A, 4B and 4C illustrate cross-sectional views of an IC interconnect structure evolving to include a graphene cap as operations in the methods illustrated in FIG. 3 are practiced, in accordance with some embodiments.
Figure 4B:
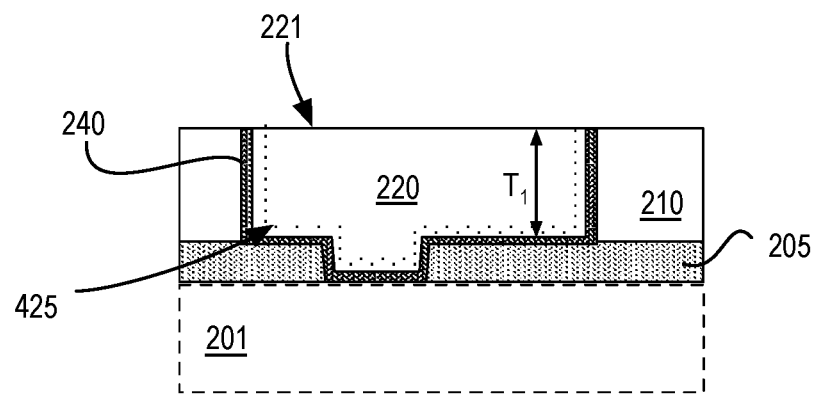
Figure 4C:
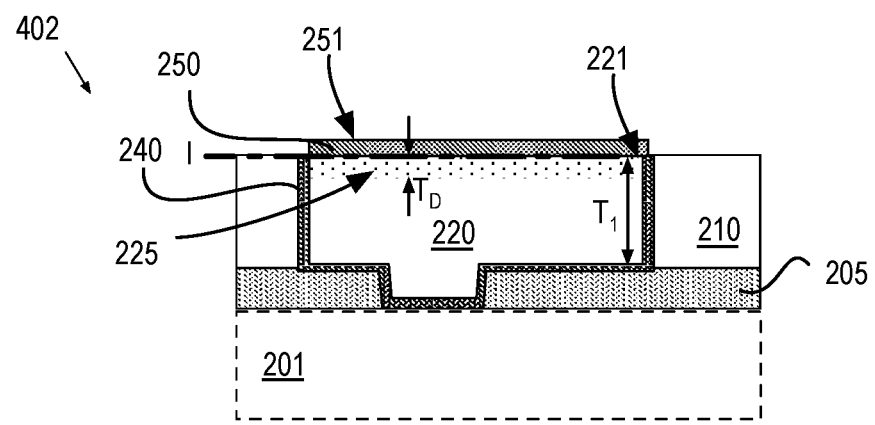

FIG. 3 is a flow diagram illustrating methods 300 for introducing a dopant into an IC interconnect structure, in accordance with some embodiments. FIG. 4A-4C illustrate cross-sectional views of an IC interconnect structure evolving to include a graphene cap as operations in methods 300 are practiced, in accordance with some embodiments.

Referring first to FIG. 3, methods 300 again begin at input 105 where a workpiece with ILD is received. In exemplary (dual)damascene embodiments, the ILD has been patterned with via openings and/or trenches. At block 320, one or more barrier layer(s) and/or adhesion layer(s) is optionally deposited. For example, any of the barrier or adhesion materials described above may be deposited at block 320 with any suitable technique, such as, but not limited to, physical vapor deposition (PVD) or atomic layer deposition (ALD).

Methods 300 continue at block 325 where a layer comprising the metal dopant is deposited, for example with any blanket deposition process (e.g., PVD). FIG. 4A illustrates an example where a seed layer 420 has been deposited directly onto barrier layer 240. Any of the metal dopants described above may be readily deposited to any desired concentration by sputtering a target of a suitable alloy or by co-sputtering multiple targets. In some embodiments, seed layer 420 is predominantly Cu and further comprises at least one of Mn, Zn, Mg, Co, or Al. Seed layer 420 may be deposited to any thickness needed to facilitate a subsequent electrolytic deposition process, and/or to incorporate enough of the metal dopant.

Returning to FIG. 3, methods 300 continue at block 330 where interconnect metal is deposited. For damascene embodiments, overburden may be removed at block 330 with a planarization process. In exemplary embodiments where interconnect metal is predominantly Cu, block 330 comprises an electrolytic plating process. However, other deposition techniques known to be suitable for other metals may also be practiced at block 330. In the example illustrated in FIG. 4B, interconnect metal 220 has been deposited and planarized to thickness $T_1$ so that top interconnect metal surface 221 is co-planar with a surface of dielectric material 210. As further illustrated, following the formation of interconnect metal 220, metal dopants 425 are concentrated proximal to seed layer 420.

Returning to FIG. 3, methods 300 continue at block 150 with formation of the graphene cap, for example substantially as described above. The IC device may then be completed at output 180. In the example further illustrated in FIG. 4C, the composition of interconnect metal 220 is advantageously suitable for nucleation of a graphene passivation layer. Selective deposition of graphene is possible on an interconnect surface comprising predominantly Cu, Ru, or Co, for example. During the deposition process, crystals of graphene nucleate selectively upon interconnect metal sites with little to no graphene forming on dielectric material 210. In embodiments where the composition of interconnect metal 220 is not suitable for nucleating graphene, a seed or cap layer (not depicted) may be first deposited upon interconnect metal top surface 221. Graphene may then be grown upon the surface of that cap layer. For example, in an embodiment where interconnect metal 220 is predominantly other than Cu (e.g., W), a cap layer of predominantly Cu or Co may be deposited onto interconnect metal top surface 221. Such a metal cap layer may be selectively deposited on interconnect metal top surface 221, for example by either electroless deposition (ED), CVD, or atomic layer deposition (ALD). Alternatively, such a metal cap layer may be unselectively formed with any blanket deposition (e.g., PVD). A blanket metal cap layer may then be subtractively patterned, for example to remain only interconnect metal top surface 221.

As further illustrated in FIG. 4C, metal dopants 425 have migrated away from the seed layer to become dopants 225 concentrated proximal to graphene cap interface I. This dopant migration may be motivated through elevated temperature processing. For example, metal dopants may migrate sufficiently during (CVD) growth of graphene cap 250 conducted at a temperature of at least 250° C. for a majority of the dopants be within thickness $T_D$ of interconnect metal 220. Alternatively, a majority of the metal dopants may be driven into thickness $T_D$ during a BEOL thermal anneal, which may be performed at any point subsequent to the formation of graphene cap 250. Such an anneal may be performed at a temperature of 200-350° C., for example. With the interconnect structure 402 substantially complete, methods 300 (FIG. 3) may be repeated to form other interconnect structures at a next higher interconnect level, for example to arrive at the IC device structure 200 (FIG. 2).

Figure 5:
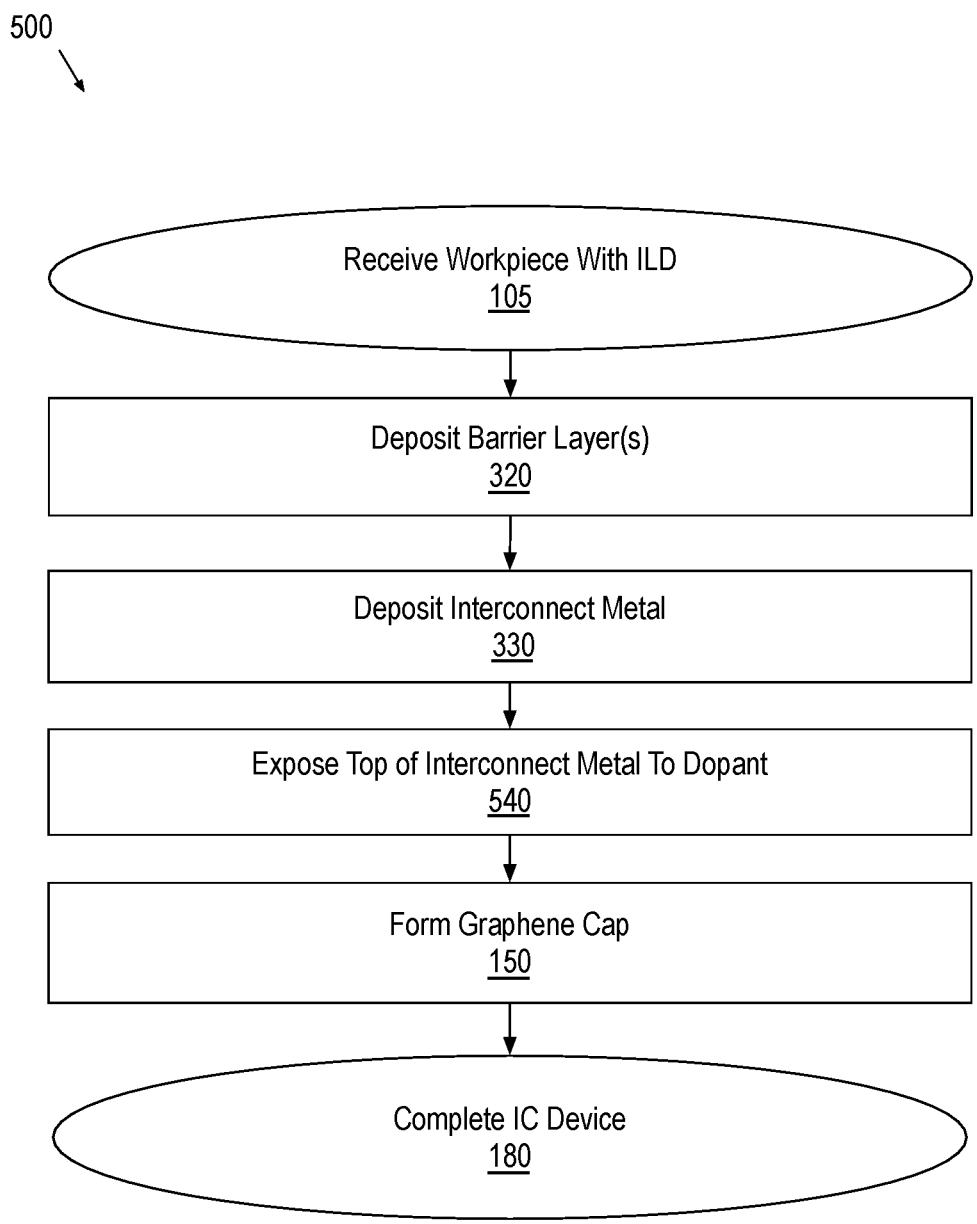
FIG. 5 is a flow diagram illustrating methods of a graphene cap into an IC interconnect structure, in accordance with some embodiments.
Figure 6A:
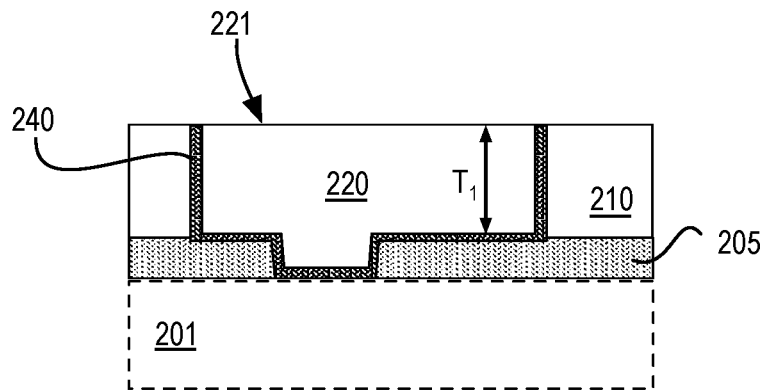
FIGS. 6A, 6B and 6C illustrate cross-sectional views of an IC interconnect structure evolving to include a graphene cap as operations in the methods illustrated in FIG. 5 are practiced, in accordance with some embodiments.
Figure 6B:
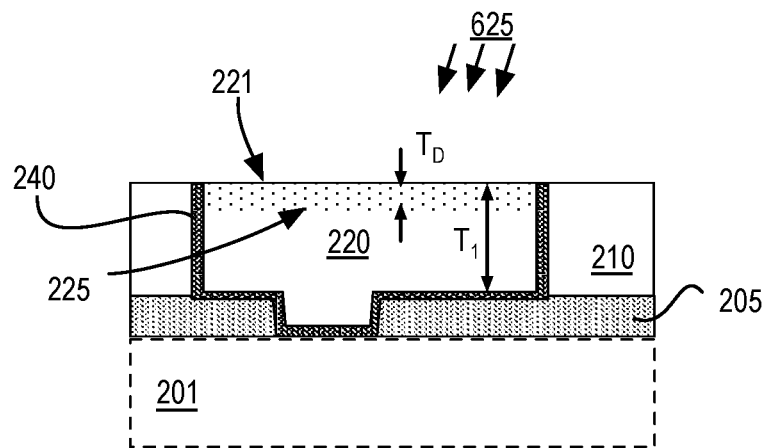
Figure 6C:
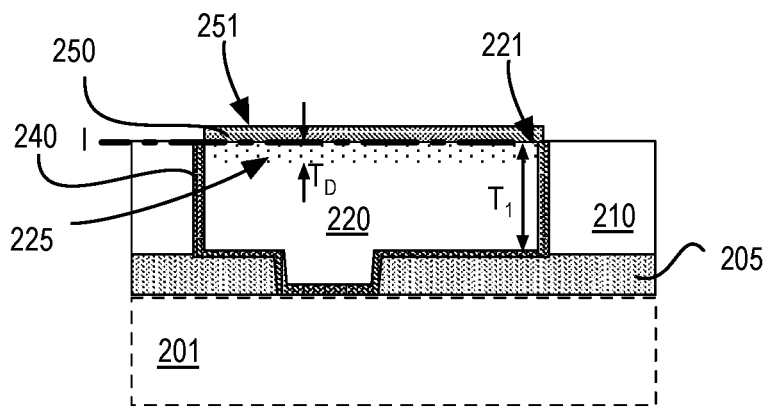

As noted above, dopants may also be locally introduced into a top of an interconnect metal through a surface treatment. The surface treatment may be performed prior to, during, or after, a graphene cap is formed on the interconnect metal. FIG. 5 is a flow diagram illustrating methods 500 for integrating a graphene cap into an IC interconnect structure, in accordance with some embodiments. FIG. 6A-6C illustrate cross-sectional views of an IC interconnect structure evolving to include a graphene cap as operations in the method 500 are practiced, in accordance with some embodiments.

Referring first to FIG. 5, methods 500 again begin with input 105. Optionally, a barrier layer and/or adhesion layer is deposited at block 320. At block 330, interconnect metal is deposited, and may be planarized with surrounding dielectric material for damascene embodiments. For embodiments where block 330 entails an electrolytic plating process, a seed layer may be deposited, but the metal dopants that were incorporated into the seed layer for methods 300 (FIG. 3) may be omitted. In the example illustrated in FIG. 6A, interconnect metal 220 has been deposited, and top surface 221 planarized with a surface of dielectric material 210. As illustrated, interconnect metal 220 is of a substantially homogenous composition. For example, the entirety of interconnect metal 220 may be a homogenous Cu-rich, Ru-rich, Mo-rich, W-rich or Co-rich alloy.

Returning to FIG. 5, methods 500 continue at block 540 where a dopant is introduced through a top surface of interconnect metal. In the example further illustrated in FIG. 6B, doping 625 may be by any of a chemical vapor treatment, plasma treatment, ion implantation, wet chemical treatment, or thin film deposition, for example. Any of the dopants described above may be introduced by doping 625. Dopant 225 may be introduced into top surface 221, for example by solid state diffusion from a deposited thin film that may then be stripped off as sacrificial following a thermal drive. In some embodiments, doping 225 comprises a vapor phase process during which interconnect metal top surface 221 is exposed to one or more of the metal dopants described elsewhere herein. For example, Al may be deposited upon a copper interconnect metal top surface 221. In other embodiments, doping 625 comprises a plasma and/or chemical vapor process during which interconnect metal top surface 221 is exposed to a nitrogen source gas, such as $NH_3$, $N_2H_4$, $N_2O$, or $N_2$. In other embodiments, doping 625 comprises a plasma and/or chemical vapor phase process during which interconnect metal top surface 221 is exposed to a silicon source gas, such as a silane (e.g., $SiH_4$).

Methods 500 (FIG. 5) continue at block 150 where the graphene cap is formed, for example substantially as described elsewhere herein. The IC device structure may then be completed at output 180. In the example further illustrated in FIG. 6C, graphene cap 250 is grown directly on interconnect top surface 221 in the presence of dopant 225. Accordingly, dopant 225 may alter the initial nucleation of graphene cap 250. If such alteration is undesirable, blocks 540 and 150 may be sequenced so that graphene cap 250 is at least partially formed prior to the surface doping.

Figure 7A:
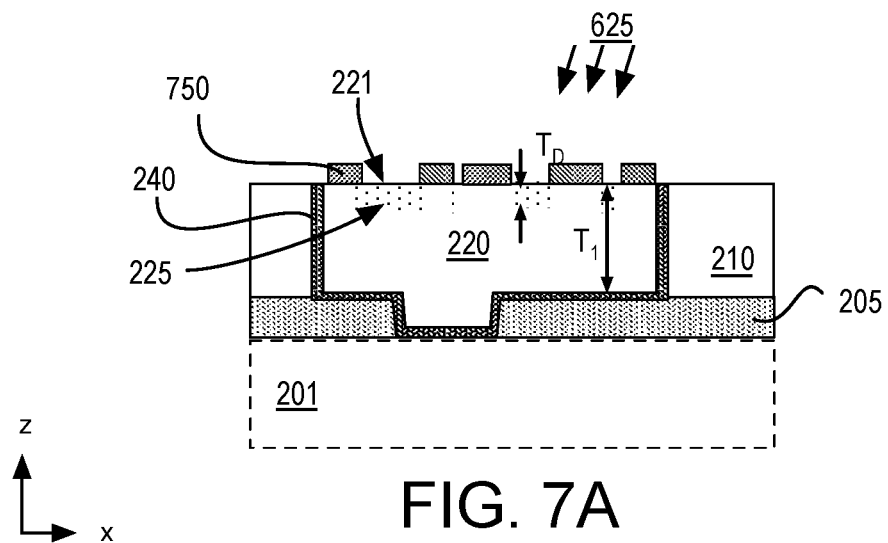
FIGS. 7A and 7B illustrate cross-sectional views of an IC interconnect structure evolving to include a graphene cap as operations in the methods illustrated in FIG. 5 are practiced, in accordance with some alternative embodiments.
Figure 7B:
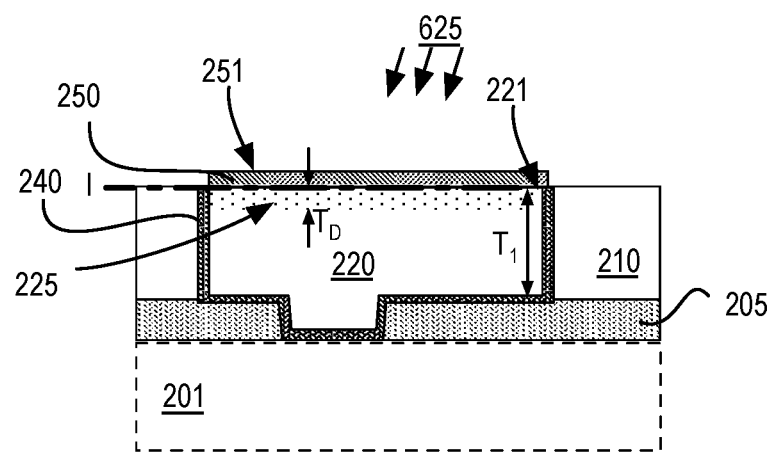

FIGS. 7A and 7B illustrate cross-sectional views of an IC interconnect structure evolving to include a graphene cap as operations in the methods 500 are practiced, in accordance with some alternative embodiments. FIG. 7A illustrates an example where doping 625 is performed after the nucleation of graphene grains 750, but prior to coalescence of grains 750. Dopant 225 may be localized to only those regions of interconnect metal 220 that are below spaces between grains 750. Such localization of dopant 225 may further reduce a change in electrical resistivity of the interconnect structure attributable to dopant 225. A dielectric material may be deposited over, and within spaces separate graphene grains 750. Alternatively, before dielectric material is deposited, graphene growth may be continued to coalesce grains 750 into a contiguous graphene cap, for example substantially as described above. FIG. 7B illustrates another example where doping 625 is performed after graphene cap 250 has been formed. For such embodiments, graphene cap 250 (being polycrystalline with small grain size) does not fully mask doping 625. Dopants 225 can enter interconnect metal 220, for example through the many grain boundaries, to a depth of thickness $T_D$.

Figure 8:
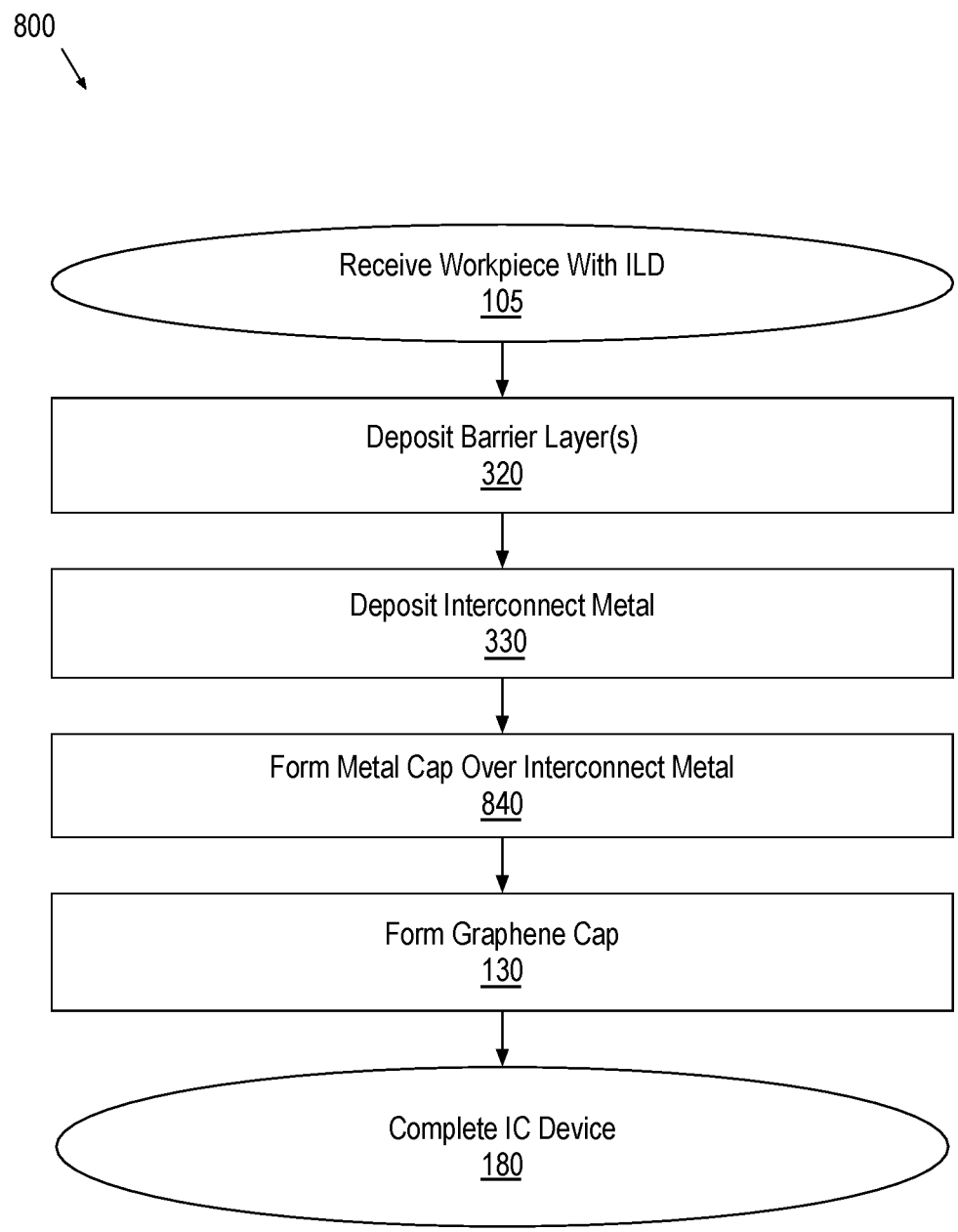
FIG. 8 is a flow diagram illustrating methods of integrating a graphene cap into an IC interconnect structure, in accordance with some embodiments.
Figure 9A:
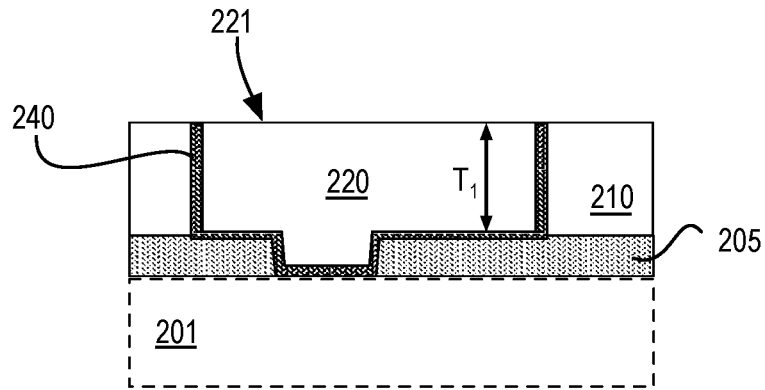
FIGS. 9A, 9B and 9C illustrate cross-sectional views of an IC interconnect structure evolving to include a graphene cap as operations in the methods illustrated in FIG. 8 are practiced, in accordance with some embodiments.
Figure 9B:
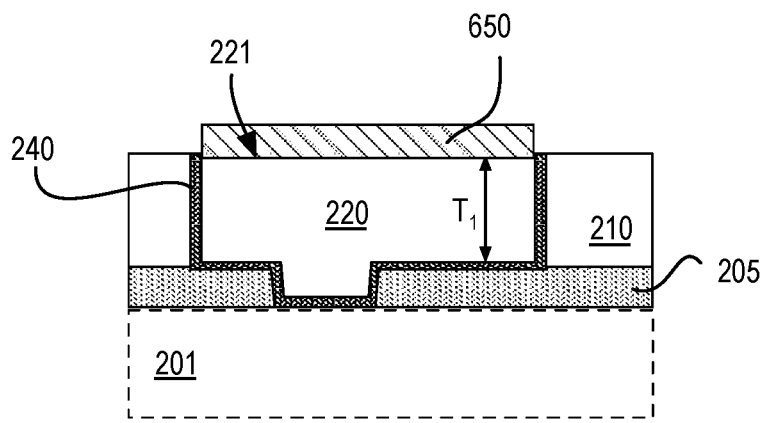
Figure 9C:
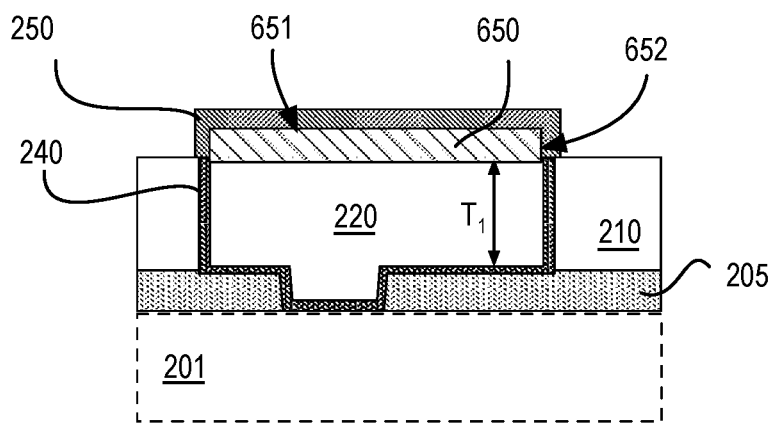

In accordance with some alternative embodiments, a graphene cap is formed instead formed upon an intervening metal cap that has good adhesion to both the interconnect metal and the graphene cap. The metal cap may also facilitate nucleation of graphene, and is advantageously a metal that also improves EM resistance of the interconnect structure. For example, one or more of the metal dopants described above may be deposited as a continuous thin film layer. FIG. 8 is a flow diagram illustrating methods 800 for integrating a graphene cap into an IC interconnect structure, in accordance with some embodiments. FIG. 9A-9C illustrate cross-sectional views of an IC interconnect structure evolving to include a graphene cap as operations in the methods 800 are practiced, in accordance with some embodiments.

Referring first to FIG. 8, methods 800 being at input 105 and include blocks 320 and 330, each of which may be practiced substantially as described elsewhere herein. At block 840, a metal cap is formed on interconnect metal. A graphene cap is then formed on the metal cap at block 130, and methods 800 are completed at output 180. In the example illustrated in FIG. 9A, an interconnect structure includes interconnect metal 220 substantially as described elsewhere herein. Metal cap 650 is formed upon interconnect metal top surface 221, for example with a deposition process, such as ED, CVD or ALD, that is selective to interconnect metal 220. In some exemplary embodiments where interconnect metal 220 is Cu-rich, metal cap 650 is predominantly Co. As further illustrated in FIG. 9C, graphene cap 250 is nucleated on metal cap 650 and grows both on metal cap top surface 651 and metal cap sidewall 652.

Figure 10:
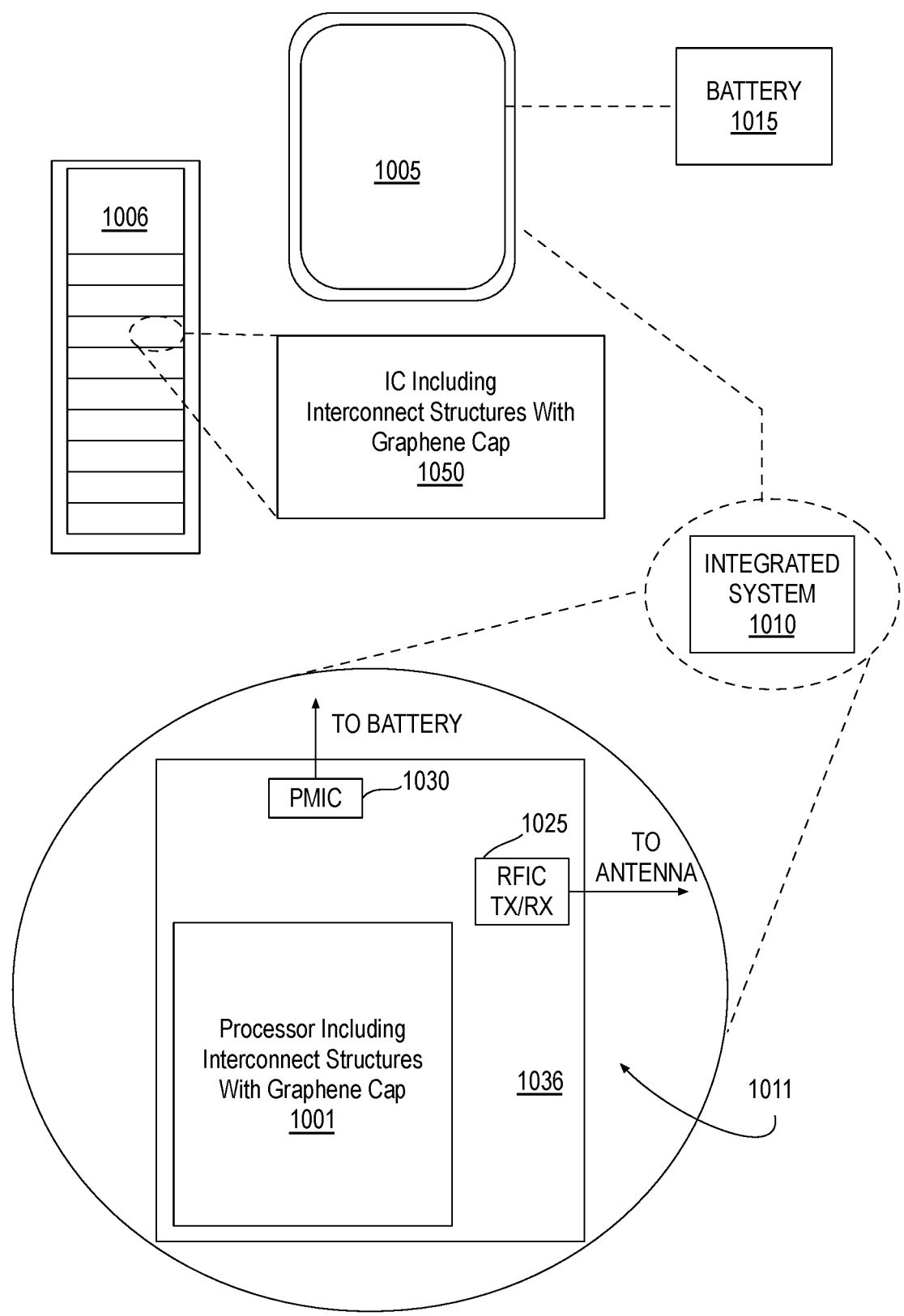
FIG. 10 illustrates a mobile computing platform and a data server machine employing an IC including transistor structures with a source and drain stop layer, in accordance with embodiments.

The interconnect structures, and the methods of forming such structures, described herein may be integrated into a wide variety of ICs and computing systems that include such ICs. FIG. 10 illustrates a system in which a mobile computing platform 1005 and/or a data server machine 1006 employs an IC having a memory and/or microprocessor IC with one or more interconnect structures, for example in accordance with some embodiments described elsewhere herein. In some embodiments, the transistor structure is coupled to an I/O of the memory and/or microprocessor IC. The server machine 1006 may be any commercial server, for example including any number of high-performance computing platforms within a rack and networked together for electronic data processing, which in the exemplary embodiment includes a monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level integrated system 1010, and a battery 1015.

Whether disposed within the integrated system 1010 comprising an assembly of multiple chips as illustrated in the expanded view 1011, or as a stand-alone packaged IC chip within the server machine 1006, a device may include memory circuitry (e.g., RAM), and/or a logic circuitry (e.g., a microprocessor, a multi-core microprocessor, graphics processor, or the like). At least one of these circuitries further includes one or more interconnect structures, for example in accordance with some embodiments described elsewhere herein. A processor IC 1001, for example may be further coupled to anther IC chip or package substrate 1036 that further hosts one or more additional IC s, such as power management IC 1030 and radio frequency IC 1025. RFIC 1025 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 11:
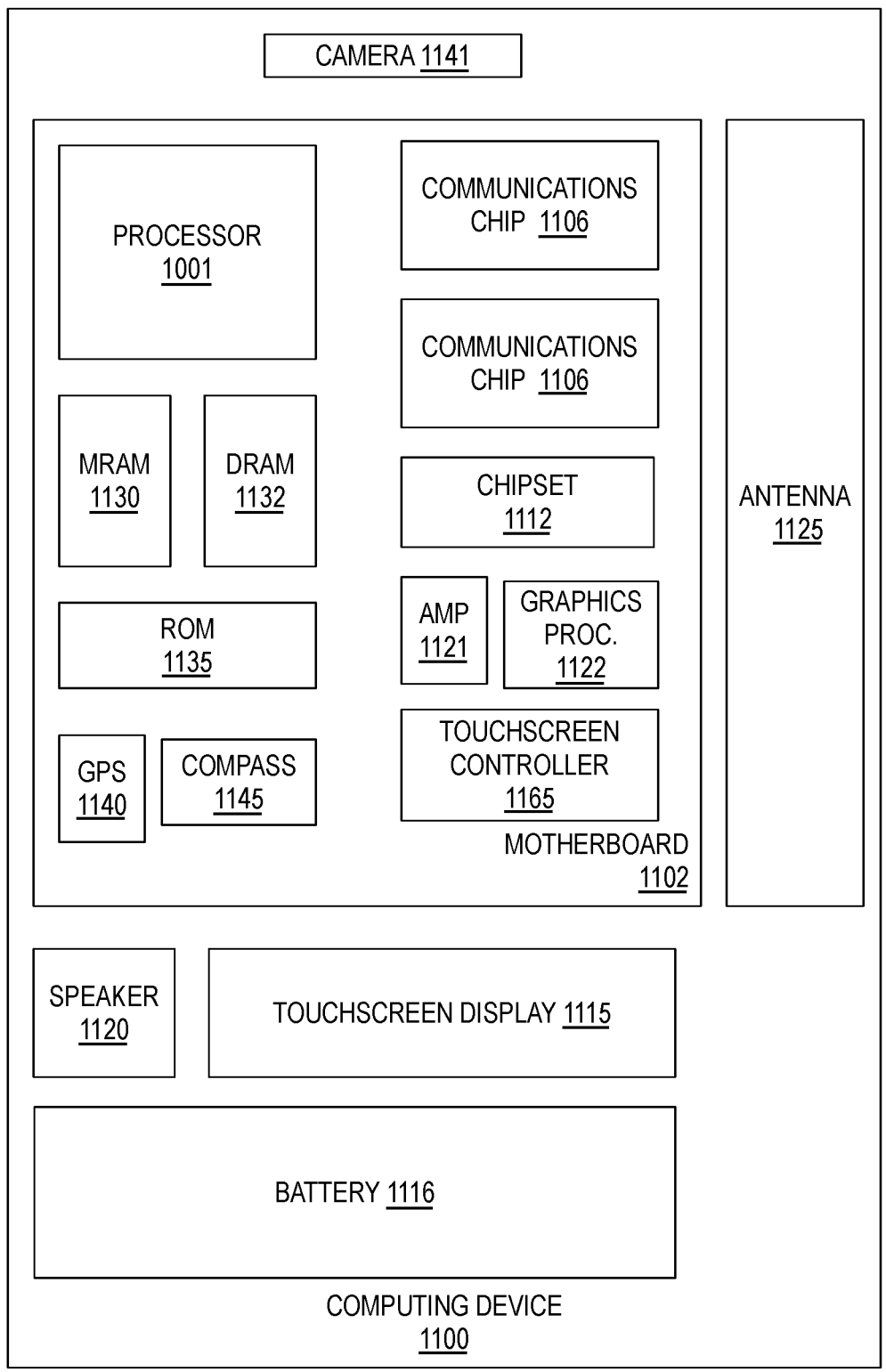
FIG. 11 is a functional block diagram of an electronic computing device, in accordance with some embodiments.

FIG. 11 is a functional block diagram of an electronic computing device 1100, in accordance with some embodiments. Device 1100 further includes a motherboard 1102 hosting a number of components, such as, but not limited to, processor 1001 (e.g., an applications processor). Processor 1001 may be physically and/or electrically coupled to motherboard 1102. In some examples, processor 1001 is part of an IC including one or more interconnect structures, for example in accordance with some embodiments described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1001. Depending on its applications, computing device 1100 may include other components that may or may not be physically and electrically coupled to motherboard 1102. These other components include, but are not limited to, volatile memory (e.g., DRAM 1132), non-volatile memory (e.g., ROM 1135), flash memory (e.g., NAND or NOR), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth, or the like.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) structure, comprises a plurality of transistors and an interconnect structure coupled to at least one of the transistors. The interconnect structure comprises a first metal, and graphene over a top surface of the first metal. An amount of a second metal, nitrogen or silicon within the interconnect structure is higher proximal to an interface of the graphene than distal from the interface.

In second examples, for any of the first examples the amount of the second metal is higher proximal to the interface. The second metal is Mn, Zn, Mg, Co, or Al.

In third examples, for any of the first through second examples the second metal is Mn or Zn.

In fourth examples, for any of the first through third examples the second metal is Mn.

In fifth examples, for any of the second through fourth examples the first metal is Cu, Ru, Co, Mo, or W.

In sixth examples, for any of the fifth examples the first metal is Cu.

In seventh examples, for any of the first through sixth examples the second metal, nitrogen or silicon is substantially absent from the first metal at distances greater than 5 nm of the interface.

In eighth examples, for any of the first through seventh examples the interconnect structure further comprises a third metal in contact with a bottom of the first metal, opposite the graphene, and between the first metal and an underlying dielectric material.

In ninth examples, for any of the eighth examples the third metal is at least one of Co, Ta, or Ti.

In tenth examples, for any of the eighth through ninth examples the third metal is in contact with a sidewall of the first metal, and between the first metal and an adjacent dielectric material.

In eleventh examples, for any of the first through tenth examples the graphene comprises a plurality of grains spaced apart from adjacent grains. The amount of the second metal, nitrogen or silicon is higher proximal to the interface of the grains of graphene and the first metal. A dielectric material is over the graphene, and within spaces between the plurality of grains.

In twelfth examples, a computer platform comprises a power supply, and an integrated circuit (IC) coupled to the power supply. The IC comprises a plurality of transistors, and an interconnect structure coupled to at least one of the transistors. The interconnect structure comprises a first metal, and graphene over a top surface of the first metal. An amount of a second metal, nitrogen or silicon within the interconnect structure is higher proximal to an interface of the graphene than distal from the interface.

In thirteenth examples, for any of the twelfth examples the first metal is Cu, the amount of the second metal is higher proximal to the interface, and the second metal is Mn or Zn.

In fourteenth examples, for any of the twelfth through thirteenth examples the interconnect structure further comprises a third metal in contact with a bottom of the first metal, opposite the graphene, and between a sidewall of the first metal and an adjacent dielectric material. The third metal is at least one of Co, Ta, or Ti.

In fifteenth examples, for any of the twelfth through fourteenth examples the second metal is substantially absent from the first metal at distances greater than 5 nm of the interface.

In sixteenth examples a method of forming an integrated circuit (IC) interconnect structure comprises depositing a first metal over a dielectric material, wherein the depositing further comprises doping the first metal with a second metal, nitrogen, or silicon. The method comprises forming graphene on a top surface of the first metal with a concentration of the second metal, nitrogen or silicon within the interconnect structure being higher proximal to an interface of the graphene and the first metal than distal from the interface.

In seventeenth examples, for any of the sixteenth embodiments depositing the first metal comprises depositing a seed layer comprising Cu and the second metal, and electroplating Cu or a Cu alloy upon the seed layer.

In eighteenth examples, for any of the sixteenth through seventeenth examples forming the graphene comprises heating the first metal to at least 200° C. and diffusing a majority of the second metal from the seed layer to within 5 nm of the interface.

In nineteenth examples, for any of the sixteenth through eighteenth examples the second metal comprises Mn, Zn, Mg, or Co.

In twentieth examples, for any of the sixteenth through nineteenth examples doping the first metal with the second metal, nitrogen, or silicon comprises introducing Al, N, or Si into at least the top surface of the first metal.

In twenty-first examples, for any of the twentieth examples Al, N, or Si is introduced prior to forming the graphene on the top surface.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   a plurality of transistors; and
   an interconnect structure coupled to at least one of the transistors, wherein the interconnect structure comprises:
   a first metal; and
   graphene over, and in direct contact with, a top surface of the first metal, wherein the graphene comprises a plurality of grains spaced apart from adjacent grains, wherein an amount of a second metal, nitrogen or silicon within the first metal is higher proximal to an interface of the graphene than distal from the interface, and higher within a first region of the first metal below spaces between the grains than within a second region of the first metal immediately below individual ones of the grains.

2. The IC structure of claim 1, wherein the amount of the second metal is higher proximal to the interface, and wherein the second metal is Mn, Zn, Mg, Co, or Al.

3. The IC structure of claim 2, wherein the second metal is Mn or Zn.

4. The IC structure of claim 3, wherein the second metal is Mn.

5. The IC structure of claim 2, wherein the first metal is Cu, Ru, Co, Mo, or W.

6. The IC structure of claim 5, wherein the first metal is Cu.

7. The IC structure of claim 1, wherein the second metal, nitrogen or silicon is substantially absent from the first metal at distances greater than 5 nm of the interface.

8. The IC structure of claim 1, wherein the interconnect structure further comprises a third metal in contact with a bottom of the first metal, opposite the graphene, and between the first metal and an underlying dielectric material.

9. The IC structure of claim 8, wherein the third metal is at least one of Co, Ta, or Ti.

10. The IC structure of claim 8, wherein the third metal is in contact with a sidewall of the first metal, and between the first metal and an adjacent dielectric material.

11. The IC structure of claim 1, wherein
a dielectric material is over the graphene, and within the spaces between the grains.

12. A computer platform comprising:
a power supply; and
an integrated circuit (IC) coupled to the power supply, wherein the IC comprises the IC structure of claim 1.

13. The platform of claim 12, wherein:
the first metal is Cu;
and
the second metal is Mn or Zn.

14. The platform of claim 13, wherein
the interconnect structure further comprises a third metal in contact with a bottom of the first metal, opposite the graphene, and between a sidewall of the first metal and an adjacent dielectric material;
the third metal is at least one of Co, Ta, or Ti.

15. The platform of claim 13, wherein the second metal is substantially absent from the first metal at distances greater than 5 nm of the interface.

16. A method of forming an integrated circuit (IC) interconnect structure, comprising:
depositing a first metal over a dielectric material;

forming graphene directly on a top surface of the first metal; and doping first regions of the first metal that are below spaces between grains of the graphene with a concentration of a second metal, nitrogen or silicon that is higher than within second regions of the first metal that are immediately below individual ones of the grains.

17. The method of claim 16, wherein:

depositing the first metal comprises depositing a seed layer comprising Cu, and electroplating Cu or a Cu alloy upon the seed layer.

18. The method of claim 17, wherein the second metal comprises Mn, Zn, Mg, or Co.

19. The method of claim 16, wherein doping the first regions of the first metal with the second metal, nitrogen, or silicon comprises introducing Al, N, or Si into at least the top surface of the first metal.

* * * * *